US012619038B2

(12) United States Patent
Shaw

(10) Patent No.: US 12,619,038 B2
(45) Date of Patent: May 5, 2026

(54) APPROACH TO PREVENT PLATING AT V-GROOVE ZONE IN PHOTONICS SILICON DURING BUMPING OR PILLARING

(71) Applicant: Intel Corporation, Santa Clara, CA (US)

(72) Inventor: Santosh Shaw, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 267 days.

(21) Appl. No.: 17/710,725

(22) Filed: Mar. 31, 2022

(65) Prior Publication Data

US 2023/0314735 A1     Oct. 5, 2023

(51) Int. Cl.
*G02B 6/42*     (2006.01)
*H01L 23/00*     (2006.01)

(52) U.S. Cl.
CPC ......... *G02B 6/4243* (2013.01); *G02B 6/4206* (2013.01); *H01L 24/03* (2013.01); *H01L 24/05* (2013.01); *H01L 24/11* (2013.01); *H01L 24/13* (2013.01); *H01L 2224/03462* (2013.01); *H01L 2224/03614* (2013.01); *H01L 2224/03622* (2013.01); *H01L 2224/0401* (2013.01); *H01L 2224/05027* (2013.01); *H01L 2224/05147* (2013.01); *H01L 2224/05166* (2013.01); *H01L 2224/11462* (2013.01); *H01L 2224/11849* (2013.01); *H01L 2224/13026* (2013.01)

(58) Field of Classification Search
CPC ..... G02B 6/4243; G02B 6/4206; H01L 24/03; H01L 24/05; H01L 24/11; H01L 24/13;

H01L 2224/03462; H01L 2224/03614; H01L 2224/03622; H01L 2224/0401; H01L 2224/05027; H01L 2224/05147; H01L 2224/05166; H01L 2224/11462; H01L 2224/11849; H01L 2224/13026
See application file for complete search history.

(56) References Cited

U.S. PATENT DOCUMENTS 6,786,651 B2 *    9/2004    Raj ......................... G02B 6/43
                                                                385/88
8,048,778 B1 *    11/2011   Ku ......................... H01L 21/78
                                                                257/E21.599
9,612,405 B2 *    4/2017    Aoki ................... G02B 6/3855
9,696,504 B2 *    7/2017    Aoki ..................... G02B 6/425
(Continued)

OTHER PUBLICATIONS

Tempo Communications, Application Note: Core Alignment Technology vs. V-groove, Sep. 2020, available at https://tempo.queup.com/web/documents/Core20Alignment20vs20V20-20Groove20Fusion20Splicers20VER203.0_2020-09-29-150009.pdf (Year: 2020).*

*Primary Examiner* — Peter Radkowski
(74) *Attorney, Agent, or Firm* — Schwabe, Williamson & Wyatt, P.C.

(57)     ABSTRACT
Embodiments disclosed herein include electronic devices and methods of forming electronic devices. In an embodiment, an electronic device comprises a die. In an embodiment, the die comprises a semiconductor substrate, a bump field over the semiconductor substrate, and a V-groove into the semiconductor substrate, wherein the V-groove extends to an edge of the semiconductor substrate. In an embodiment, the V-groove is free from conductive material. In an embodiment, the electronic device further comprises an optical fiber inserted into the V-groove.

8 Claims, 19 Drawing Sheets

(56) References Cited

U.S. PATENT DOCUMENTS

| | | | |
|---|---|---|---|
| 9,698,564 B1 * | 7/2017 | Shubin | H01S 5/026 |
| 10,224,286 B1 * | 3/2019 | England | H01L 23/49 |
| 10,566,287 B1 * | 2/2020 | Ding | H01L 23/5384 |
| 10,777,430 B2 * | 9/2020 | Yu | H01L 21/561 |
| 11,367,687 B2 * | 6/2022 | Ding | H01L 24/17 |
| 11,428,882 B2 * | 8/2022 | Raghunathan | G02B 6/4257 |
| 11,527,419 B2 * | 12/2022 | Yu | H01L 23/5386 |
| 11,664,319 B2 * | 5/2023 | Ding | G02B 6/428 |
| | | | 361/783 |
| 11,901,196 B2 * | 2/2024 | Yu | G02B 6/4239 |
| 12,057,403 B2 * | 8/2024 | Ding | H01L 25/167 |
| 12,283,492 B2 * | 4/2025 | Yu | H01L 23/5283 |
| 2002/0175339 A1 * | 11/2002 | Raj | G02B 6/43 |
| | | | 257/99 |
| 2003/0053756 A1 * | 3/2003 | Lam | G02B 6/305 |
| | | | 385/52 |
| 2004/0048458 A1 * | 3/2004 | Yang | H01L 24/11 |
| | | | 257/E23.021 |
| 2006/0160348 A1 * | 7/2006 | Pu | H01L 24/13 |
| | | | 257/E23.021 |
| 2006/0252245 A1 * | 11/2006 | Ke | H01L 24/03 |
| | | | 257/E21.508 |
| 2011/0254159 A1 * | 10/2011 | Hwang | H01L 24/05 |
| | | | 438/615 |
| 2012/0007228 A1 * | 1/2012 | Lu | H01L 24/16 |
| | | | 257/E21.582 |
| 2012/0007230 A1 * | 1/2012 | Hwang | H01L 24/11 |
| | | | 257/737 |
| 2012/0098121 A1 * | 4/2012 | Chen | H01L 21/76877 |
| | | | 257/E21.294 |
| 2012/0217633 A1 * | 8/2012 | Liu | H01L 23/3192 |
| | | | 257/737 |
| 2014/0029890 A1 * | 1/2014 | Sun | G02B 6/4249 |
| | | | 257/E33.068 |
| 2015/0117821 A1 * | 4/2015 | Aoki | G02B 6/425 |
| | | | 385/83 |
| 2015/0279793 A1 * | 10/2015 | Kuo | H01L 23/49816 |
| | | | 257/737 |
| 2016/0148891 A1 * | 5/2016 | Tsao | H01L 24/16 |
| | | | 257/737 |
| 2017/0097483 A1 * | 4/2017 | Aoki | G02B 6/4292 |
| 2019/0103541 A1 * | 4/2019 | Abraham | H01L 24/16 |
| 2020/0006088 A1 * | 1/2020 | Yu | H01L 23/3121 |
| 2020/0152574 A1 * | 5/2020 | Ding | H01L 24/81 |
| 2020/0400902 A1 * | 12/2020 | Raghunathan | G02B 6/4274 |
| 2020/0411333 A1 * | 12/2020 | Yu | G02B 6/136 |
| 2022/0319994 A1 * | 10/2022 | Ding | H01L 21/6835 |
| 2023/0109686 A1 * | 4/2023 | Yu | H01L 23/3171 |
| | | | 384/14 |
| 2023/0299008 A1 * | 9/2023 | Ding | H01L 24/81 |
| | | | 361/783 |
| 2024/0136203 A1 * | 4/2024 | Yu | G02B 6/1225 |

* cited by examiner

APPROACH TO PREVENT PLATING AT V-GROOVE ZONE IN PHOTONICS SILICON DURING BUMPING OR PILLARING

GOVERNMENT LICENSE RIGHTS

This invention was made with Government support under Agreement No. HR0011-19-3-0003, awarded by DARPA. The Government has certain rights in the invention.

TECHNICAL FIELD

Embodiments of the present disclosure relate to optical packages, and more particularly to optical packages with V-grooves that are free from bumping material.

BACKGROUND

In optoelectronic dies, V-grooves are etched into the surface of the semiconductor substrate. The V-grooves are used in order to provide passive fiber alignment during the fiber attach process. After the V-grooves are formed, a bumping process is implemented on the semiconductor substrate. The bumping process may include the use of a spin coated photoresist material. Unfortunately, the spin coating process may negatively interact with the V-grooves. For example, the topology of the V-grooves may result in the formation of bubbles in the photoresist material over the V-grooves. The bubbles may provide openings through the photoresist material. Ultimately, material is plated onto the V-groove region during the bumping process. Any residue at the V-groove area will deteriorate the fiber attach coupling efficiency and result in dB losses.

Laminated photoresist materials have been proposed instead of the spin coating process in order to provide a solution for photoresist bubble formation. In such architectures, photoresist is laminated as a semi-solid material in order to prevent bubble formation. However, lamination based photoresist processes are not standard processes for bumping patterning. As such new equipment would be needed. Additionally, the throughput of laminated photoresist processes is far less compared to spin-coating based photoresist processes. Uniform adhesion of the resist across the wafer, especially at the edges, is also challenging to accomplish. Due to the nature of the process, laminated photoresist is not currently an option for fine features and multiple steps of bumping.

EMBODIMENTS OF THE PRESENT DISCLOSURE

Figures 1A, 1B:
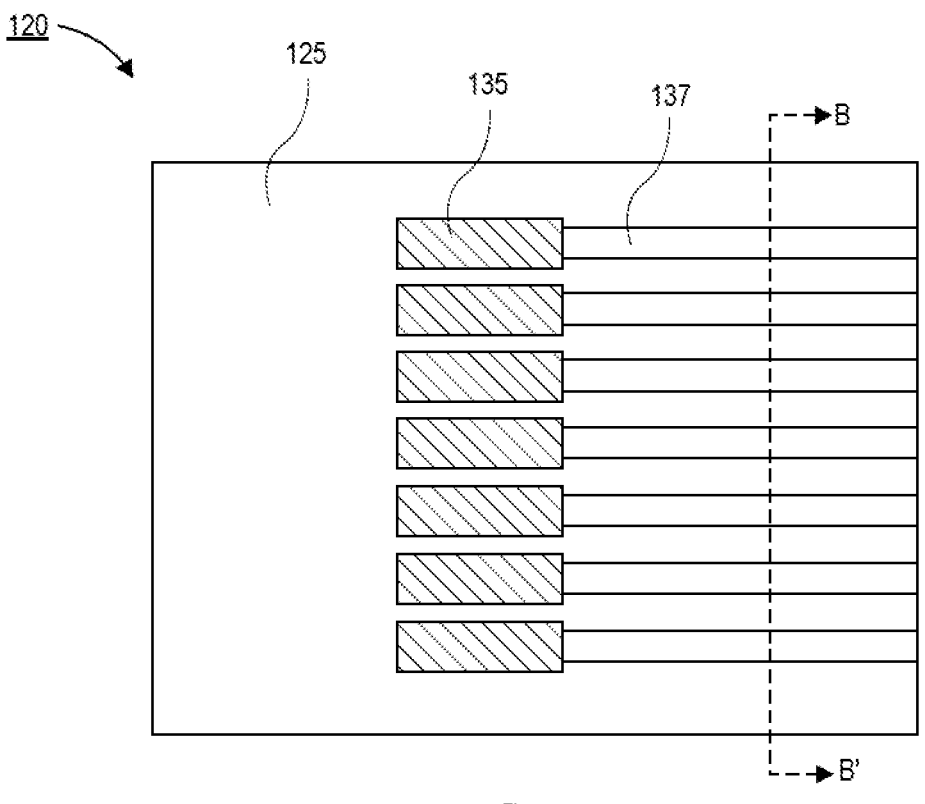
FIG. 1A is a plan view illustration of a die with V-grooves, in accordance with an embodiment.
FIG. 1B is a cross-sectional illustration of the die in FIG. 1A, in accordance with an embodiment.

Described herein are optical packages with V-grooves that are free from bumping material, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, spin-coating processes of photoresist in order to pattern the bumps on a die is problematic, especially in the presence of a V-groove region. The topology of the V-grooves in the V-groove region makes it likely that defects occur in the photoresist. For example, bubbles may be present over one or more of the V-grooves. The bubbles create openings through the photoresist material. This allows for subsequent plating of material over the surfaces of the V-groove during bump plating operations. The presence of excess material in the V-groove will deteriorate the fiber attach coupling efficiency and result in dB losses.

Accordingly, embodiments disclosed herein include a two-step photoresist deposition process. The first photoresist is disposed over the die, and an opening is provided over the V-groove region. In an embodiment, the under bump metallization (UBM) in the V-groove region is removed in order to expose the underlying silicon. Removing the UBM from the V-groove region eliminates the possibility of plating in the V-groove region during the bumping process. In an embodiment, the first photoresist is removed, and a second photoresist is applied with a spin-coating process. In an embodiment, there may be one or more bubbles over the V-groove region due to the topology of the V-grooves. However, since the underlying metal layer has been removed, there is no plating in the V-groove region during the bump plating process. Accordingly, the V-grooves can remain pristine and fiber attach coupling efficiency is high.

To provide context, FIGS. 1A-1J provide a process flow that depicts the current issues with spin-coating processes, the formation of bubbles in the V-groove region, and the plating of material in the V-grooves.

Referring now to FIG. 1A, a plan view illustration of a die 120 is shown, in accordance with an embodiment. In an embodiment, the die 120 may comprise a semiconductor substrate 125. For example, the semiconductor substrate 125 may be silicon or the like. In an embodiment, the semiconductor substrate 125 may comprise a V-groove region. The V-groove region may include one or more V-grooves 137. As shown, the V-grooves 137 extend to an edge of the semiconductor substrate 125. In an embodiment, the end of the V-grooves 137 opposite from the edge of the semiconductor substrate 125 may terminate at a spot size converter 135.

Referring now to FIG. 1B, a cross-sectional illustration of the die 120 in FIG. 1A along line B-B' is shown, in accordance with an embodiment. As shown, the die 120 comprises a plurality of V-grooves 137. In the illustrated embodiment seven V-grooves 137 are shown. However, it is to be appreciated that any number of V-grooves 137 may be included on the die 120 (e.g., one or more V-grooves 137). In the illustrated embodiment, the V-grooves 137 have a true V-shaped profile. In other embodiments, a bottom of the V-grooves 137 may be a planar surface instead of a point, as shown in FIG. 1B. In an embodiment, the V-grooves 137 may be sized to accommodate optical fibers. For example, the depth of the V-grooves 137 may be approximately 100 µm deep or less. In a particular embodiment, the V-grooves 137 may have a depth that is approximately 75 µm or less. As used herein, "approximately" may refer to a range of values that are within ten percent of the stated value. For example, approximately 100 µm may refer to a range between 90 µm and 110 µm.

Figure 1C:
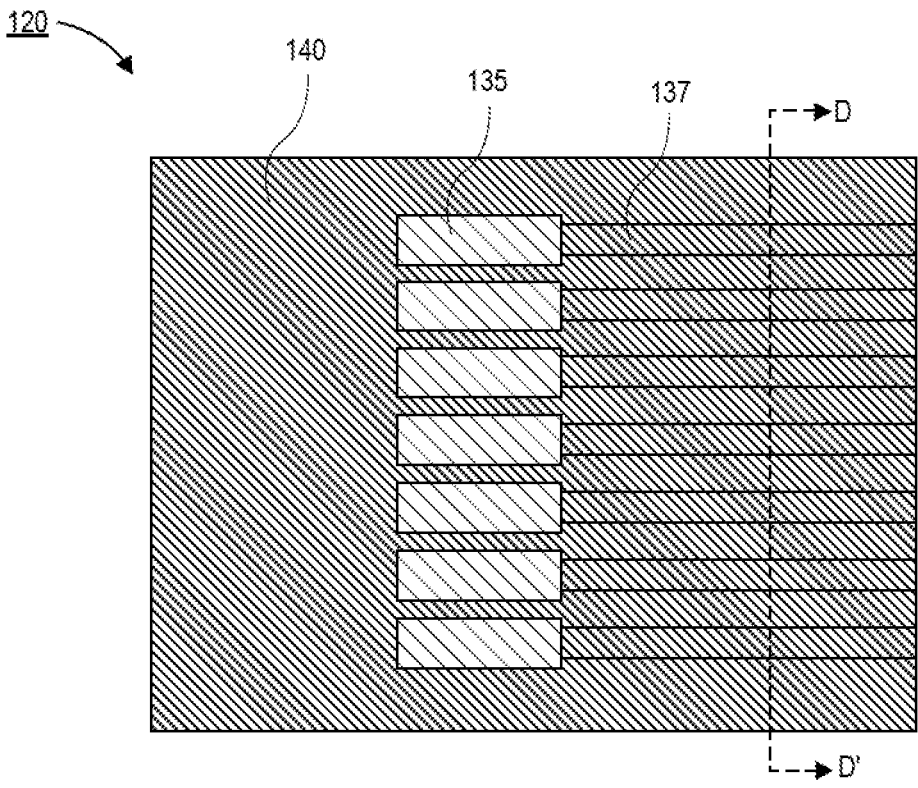
FIG. 1C is a plan view illustration of the die after an under bump metallization (UBM) layer is disposed over the surface of the die, in accordance with an embodiment.

Referring now to FIG. 1C, a plan view illustration of the die 120 after a UBM layer 140 deposition process is shown, in accordance with an embodiment. In an embodiment, the UBM layer 140 may comprise a conductive material. For example, the UBM layer 140 may comprise copper and/or titanium. In an embodiment, the UBM layer 140 may be deposited with any suitable deposition process. In a particular embodiment, the UBM layer 140 may be deposited with a sputtering process or the like. The UBM layer 140 deposition process may be a conformal blanket deposition process. There may be no shielding over the surface of the die 120 during the UBM layer 140 deposition. That is, the UBM layer 140 may be deposited across the entire surface of the die 120, including over the V-grooves 137.

Figure 1D:
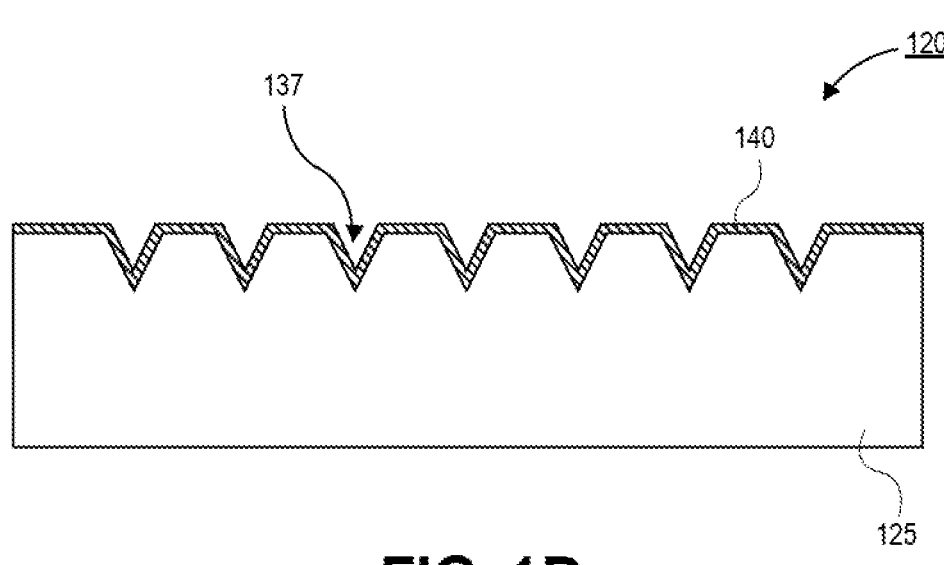
FIG. 1D is a cross-sectional illustration of the die in FIG. 1C, in accordance with an embodiment.

Referring now to FIG. 1D, a cross-sectional illustration of the die 120 in FIG. 1C along line D-D' is shown, in accordance with an embodiment. As shown, the UBM layer 140 is a conformally deposited material layer. As such, the UBM layer 140 conforms to the topology of the V-grooves 137. In an embodiment, the thickness of the UBM layer 140 may be approximately 5 µm or less, or approximately 1 µm or less.

Figures 1E, 1F:
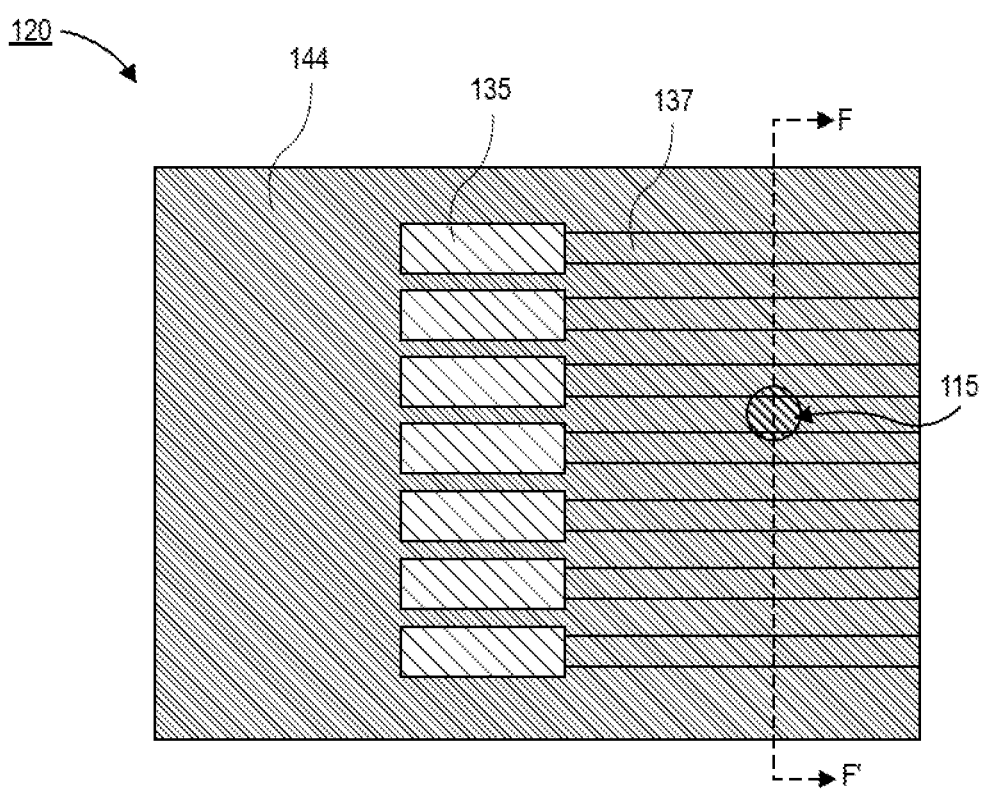
FIG. 1E is a plan view illustration of the die after a photoresist is disposed over the die and a bubble is formed over a V-groove, in accordance with an embodiment.
FIG. 1F is a cross-sectional illustration of the die in FIG. 1E, in accordance with an embodiment.

Referring now to FIG. 1E, a plan view illustration of the die 120 after a photoresist layer 144 is disposed over the die 120 is shown, in accordance with an embodiment. In an embodiment, the photoresist layer 144 may be deposited with a spin coating process. That is, a liquid material is dispensed onto the die 120 and the die is spun in order to evenly distribute the liquid material across the surface of the die 120. After the spinning process, the liquid material may be cured (e.g., baked) in order to form a more solid material. The spin coating process may result in the formation of one or more bubbles 115 in the V-groove region of the die 120. Particularly, the V-grooves 137 provide a topology that is susceptible to the bubble formation. As shown, the underlying UBM 140 can be seen through the bubble 115.

A single bubble 115 is shown in FIG. 1E. However, it is to be appreciated that multiple bubbles 115 may be formed over the V-groove region in other embodiments. Additionally, while the single bubble 115 is shown as being formed over a single V-groove 137, it is to be appreciated that larger bubbles may span across two or more V-grooves 137.

Referring now to FIG. 1F, a cross-sectional illustration of the die 120 in FIG. 1E along line F-F' is shown, in accordance with an embodiment. As shown, the bubble 115 exposes an opening that extends through a thickness of the photoresist layer 144. This exposes a portion of the UBM 140 over a V-groove 137. As noted above, the size and/or number of bubbles 115 may vary depending on the topology of the V-grooves 137 and the parameters of the spin coating process.

Figures 1G, 1H:
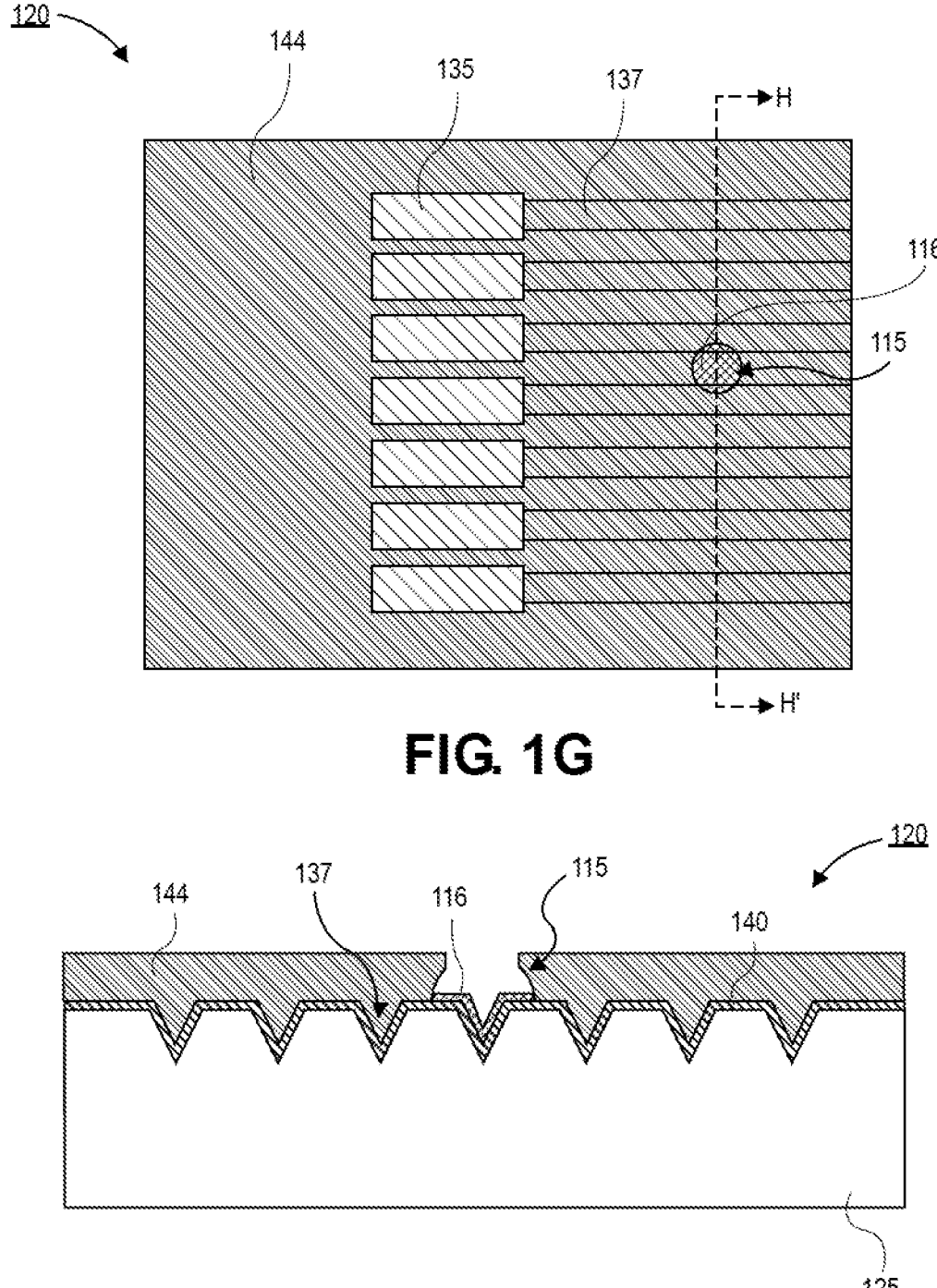
FIG. 1G is a plan view illustration of the die after a bumping process is implemented that plates metal in the bubble, in accordance with an embodiment.
FIG. 1H is a cross-sectional illustration of the die in FIG. 1G, in accordance with an embodiment.

Referring now to FIG. 1G, a plan view illustration of the die 120 after a UBM plating process is shown, in accordance with an embodiment. In an embodiment, the plating process may be an electroplating process. As such, any locations with exposed metal are susceptible to plating. Since the bubble 115 provides an opening that exposes a portion of the UBM 140, plating 116 may occur in the bubble 115.

Referring now to FIG. 1H, a cross-sectional illustration of the die 120 in FIG. 1G along line H-H' is shown, in accordance with an embodiment. As shown, the plating 116 is provided along the V-groove 137 that is exposed by the bubble 115. The amount of plating in the bubble 115 may be dependent on the amount of plating needed to form the bumps (not shown in FIGS. 1G and 1H).

Figures 1I, 1J:
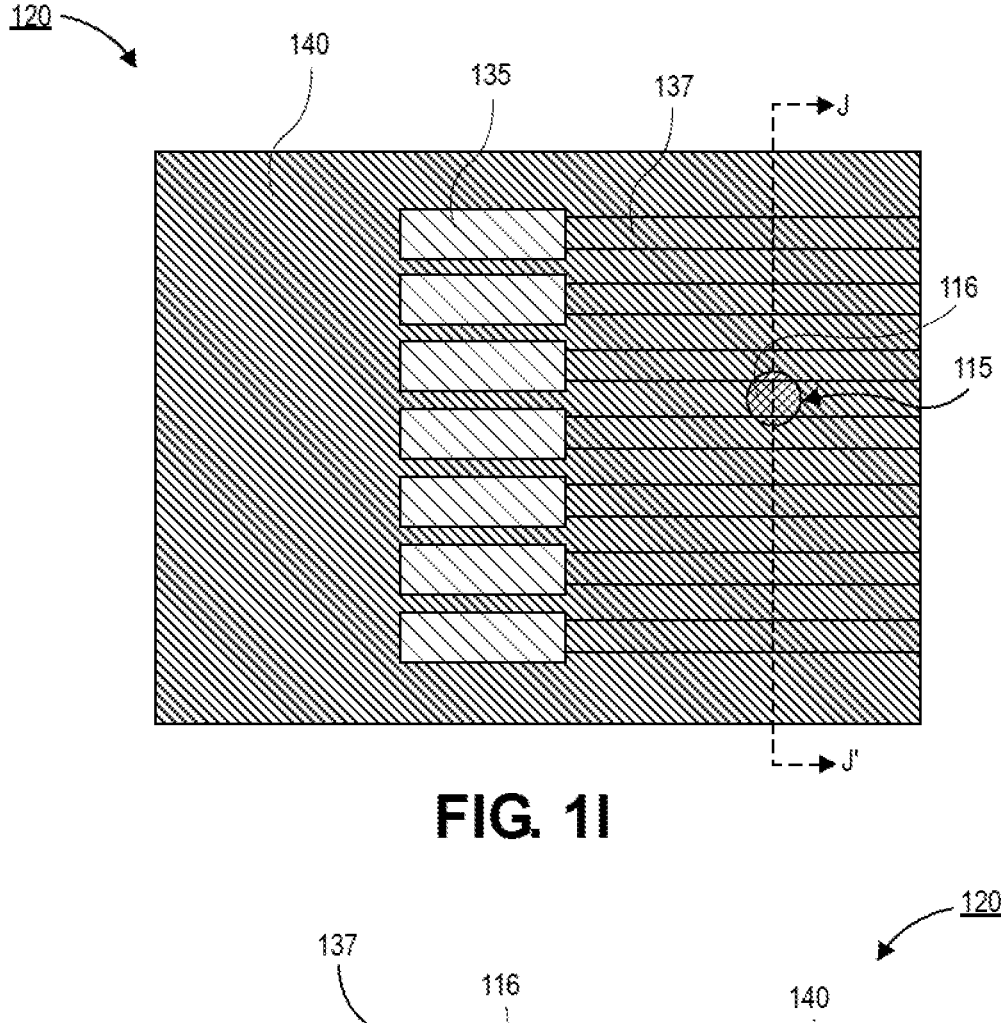
FIG. 1I is a plan view illustration of the die after the photoresist is removed, in accordance with an embodiment.
FIG. 1J is a cross-sectional illustration of the die in FIG. 1I, in accordance with an embodiment.

Referring now to FIG. 1I, a plan view illustration of the die 120 after the photoresist layer 144 is removed is shown, in accordance with an embodiment. In an embodiment, the photoresist layer 144 may be removed with a stripping process or the like. As shown, the resulting surface includes the UBM layer 140 and a plating 116 over the V-groove 137. The plating 116 negatively impacts the surface of the V-groove 137 and results in poor fiber alignment.

Referring now to FIG. 1J, a cross-sectional illustration of the die 120 in FIG. 1I along line J-J' is shown, in accordance with an embodiment. As shown, the plating 116 disrupts the V-groove 137. Accordingly, a subsequently placed optical fiber will not properly align to the spot size converter 135.

Accordingly, embodiments disclosed herein include a UBM and bumping plating process that eliminates the chances of plating through bubbles in the spin coated photoresist material. Particularly, an additional lithography operation is used to remove the UBM layer from the V-groove region. Since the UBM layer is removed, there is no conductive material that can be used to plate the bumping material in the V-groove region. Therefore, the V-groove region remains pristine and enables more efficient optical coupling to the spot size converters.

Figure 2A:
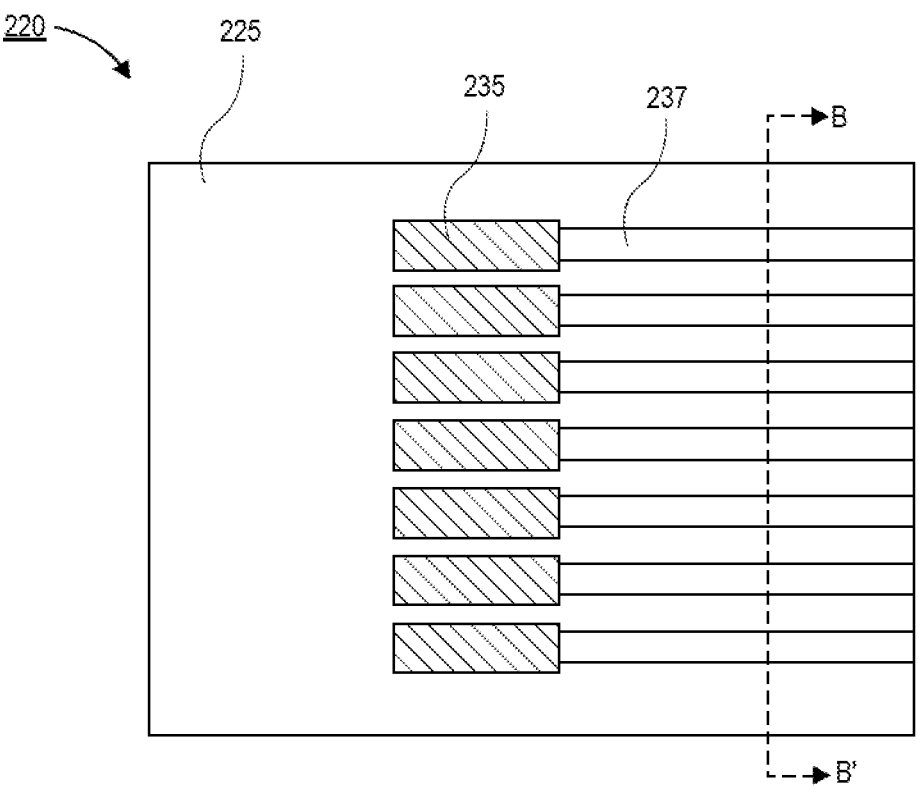
FIG. 2A is a plan view illustration of a die with a plurality of V-grooves, in accordance with an embodiment.
Figure 2B:
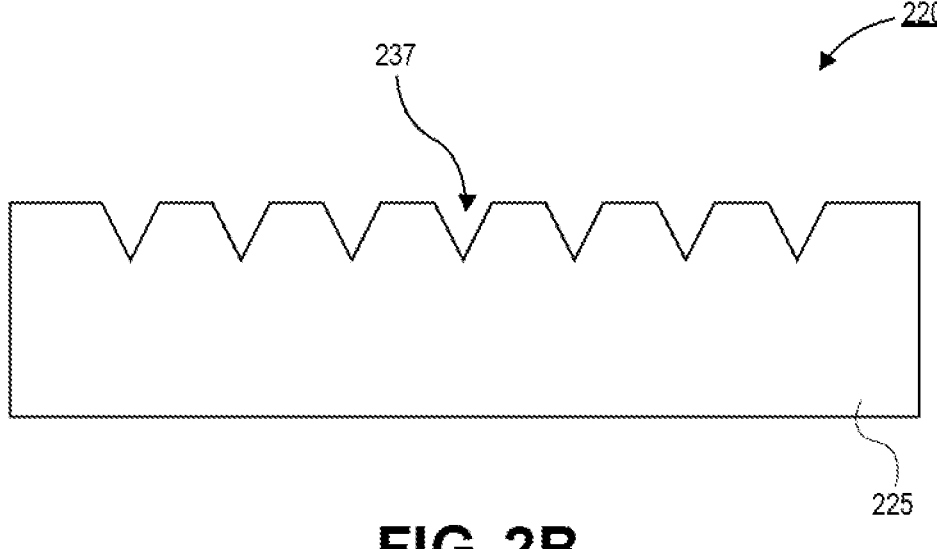
FIG. 2B is a cross-sectional illustration of the die in FIG. 2A, in accordance with an embodiment.
Figure 2C:
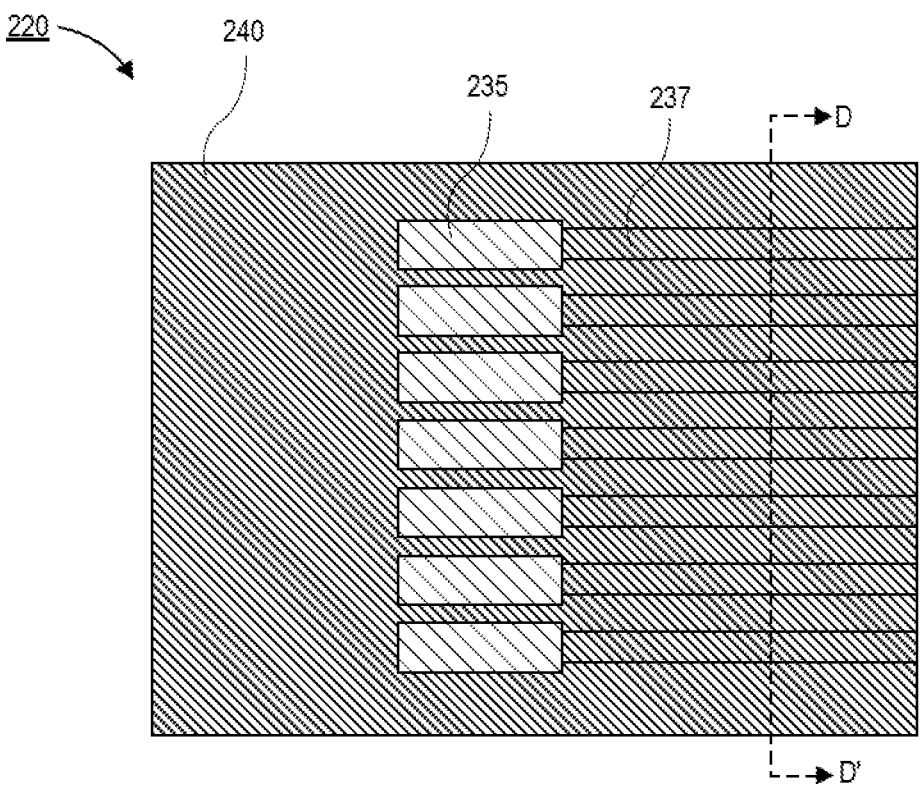
FIG. 2C is a plan view illustration of the die after a UBM layer is disposed over the surface of the die, in accordance with an embodiment.
Figure 2D:
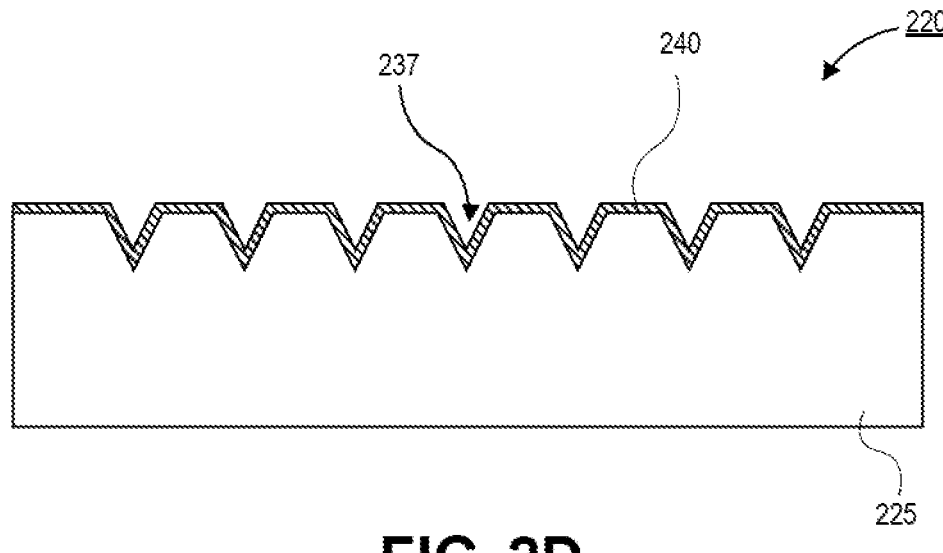
FIG. 2D is a cross-sectional illustration of the die in FIG. 2C, in accordance with an embodiment.
Figures 2E, 2F:
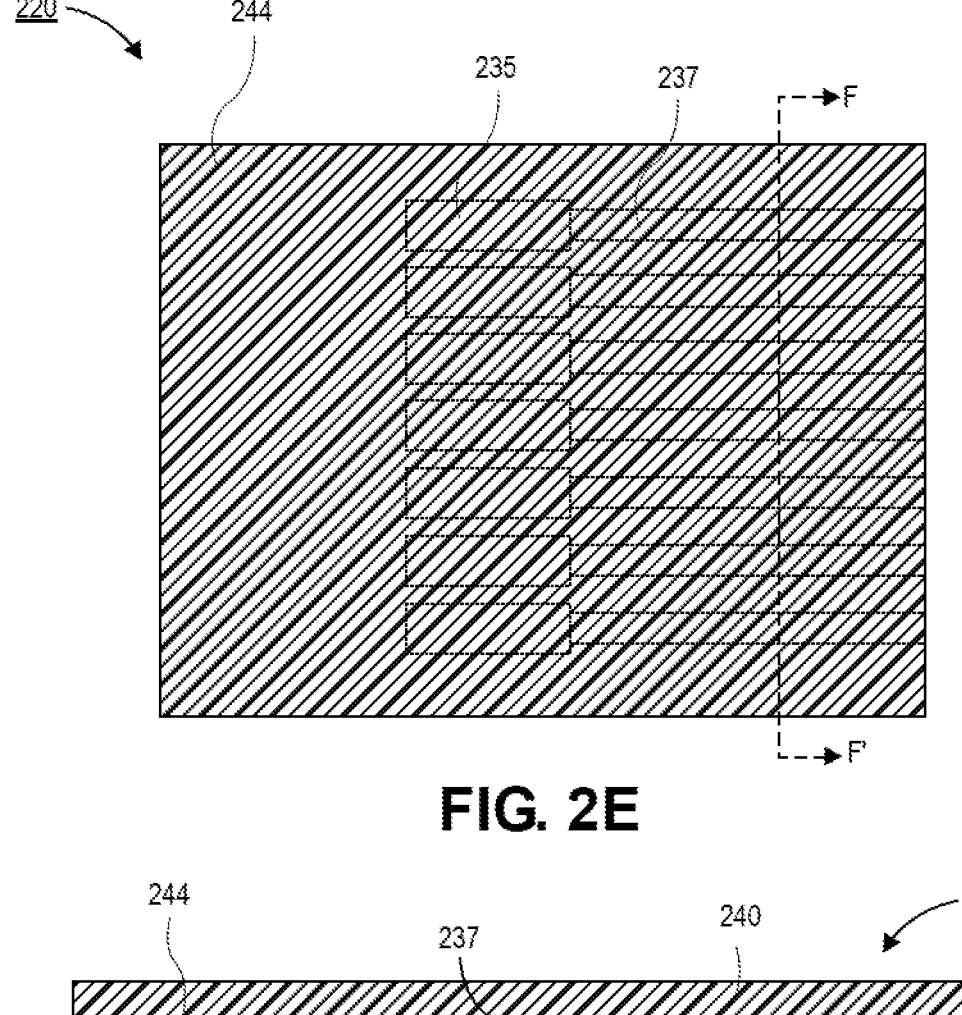
FIG. 2E is a plan view illustration of the die after a first photoresist layer is disposed over the die, in accordance with an embodiment.
FIG. 2F is a cross-sectional illustration of the die in FIG. 2E, in accordance with an embodiment.
Figure 2G:
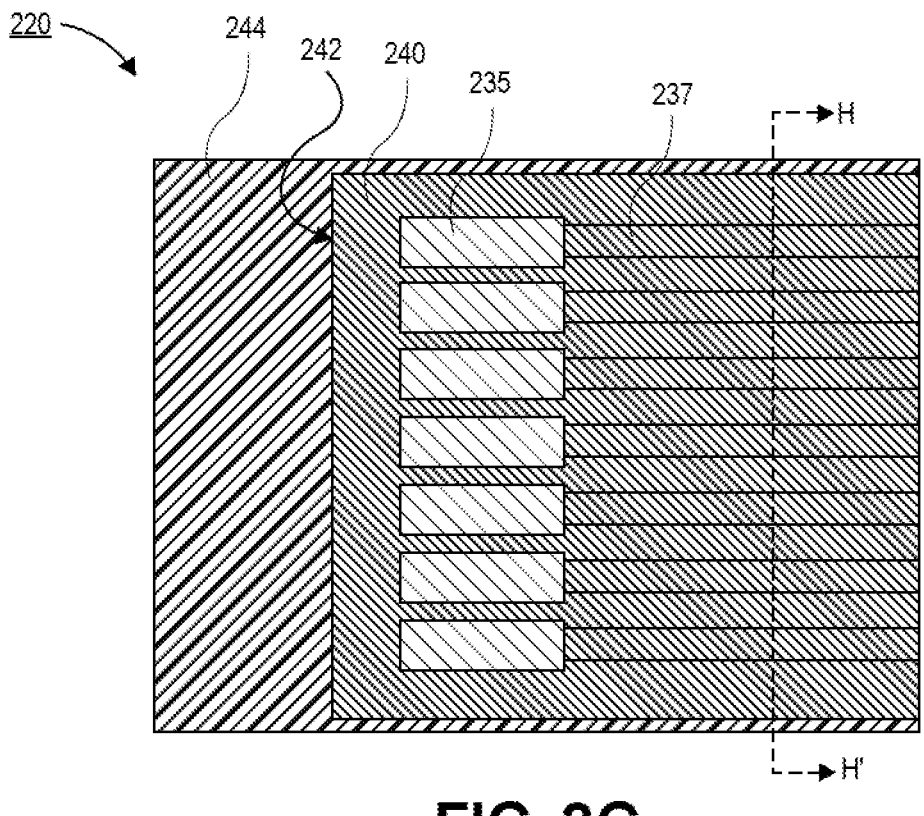
FIG. 2G is a plan view illustration of the die after an opening is formed into the photoresist layer to expose the V-groove region of the die, in accordance with an embodiment.
Figure 2H:
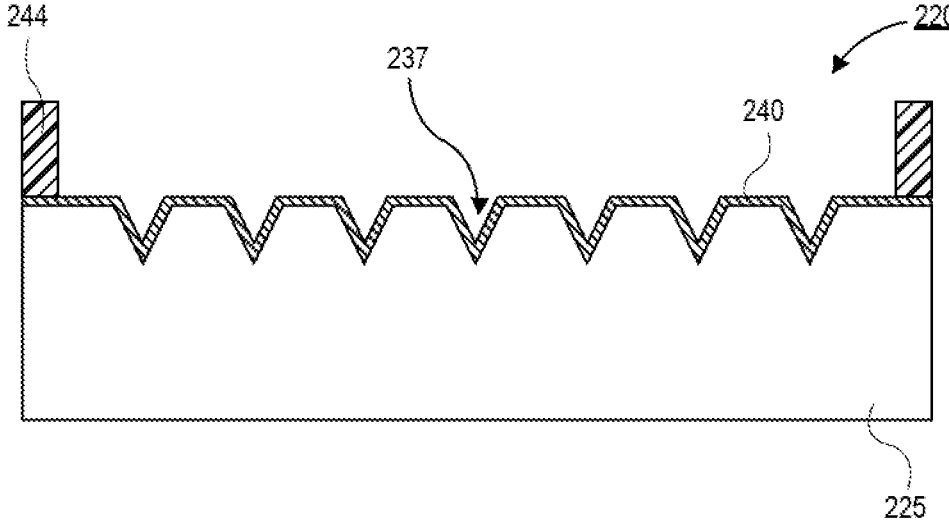
FIG. 2H is a cross-sectional illustration of the die in FIG. 2G, in accordance with an embodiment.
Figure 2I:
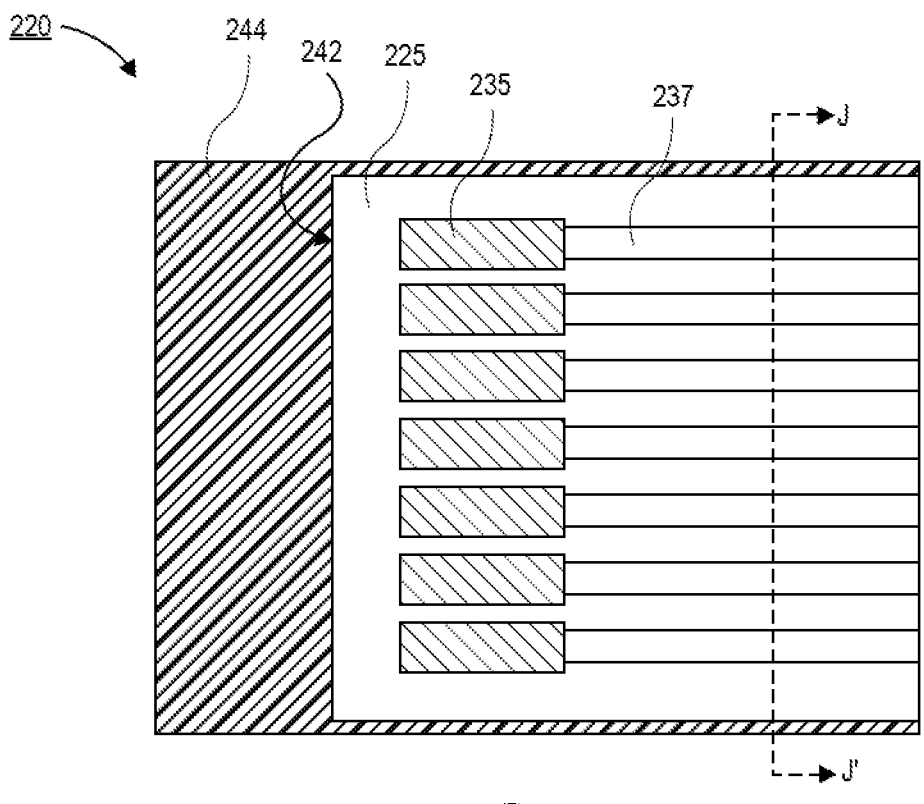
FIG. 2I is a plan view illustration of the die after the UBM is removed from the V-groove region of the die, in accordance with an embodiment.
Figure 2J:
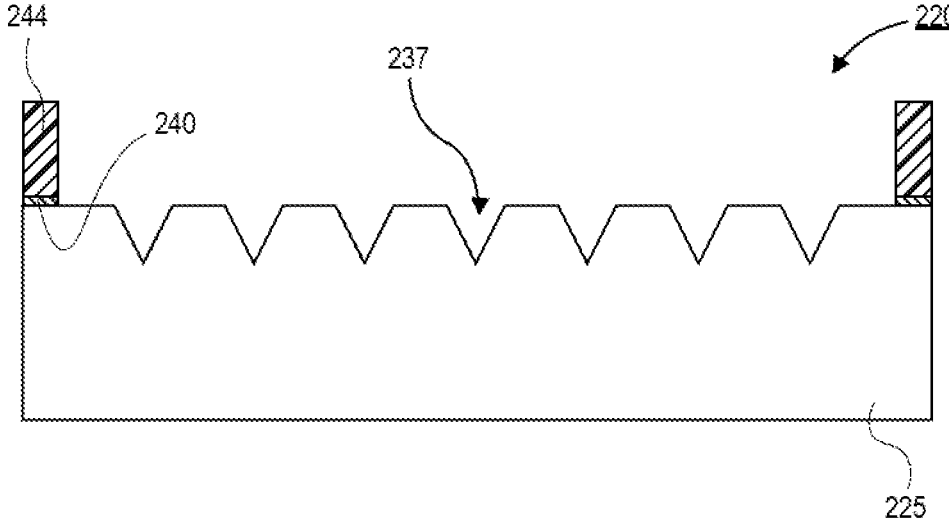
FIG. 2J is a cross-sectional illustration of the die in FIG. 2I, in accordance with an embodiment.
Figure 2K:
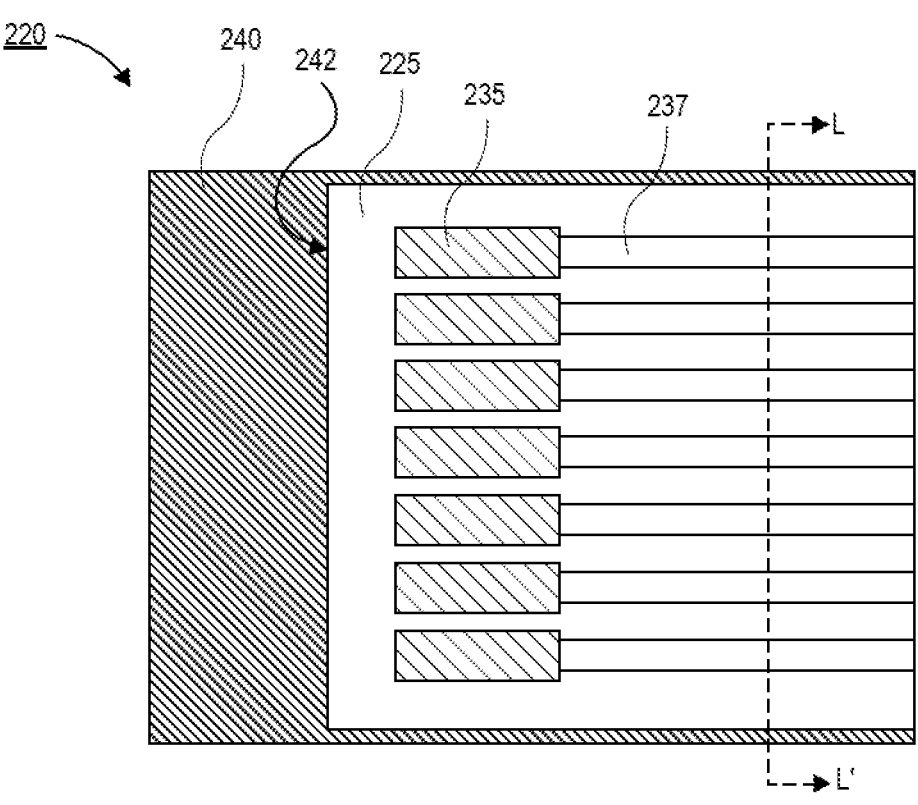
FIG. 2K is a plan view illustration of the die after the first photoresist layer is removed, in accordance with an embodiment.
Figure 2L:
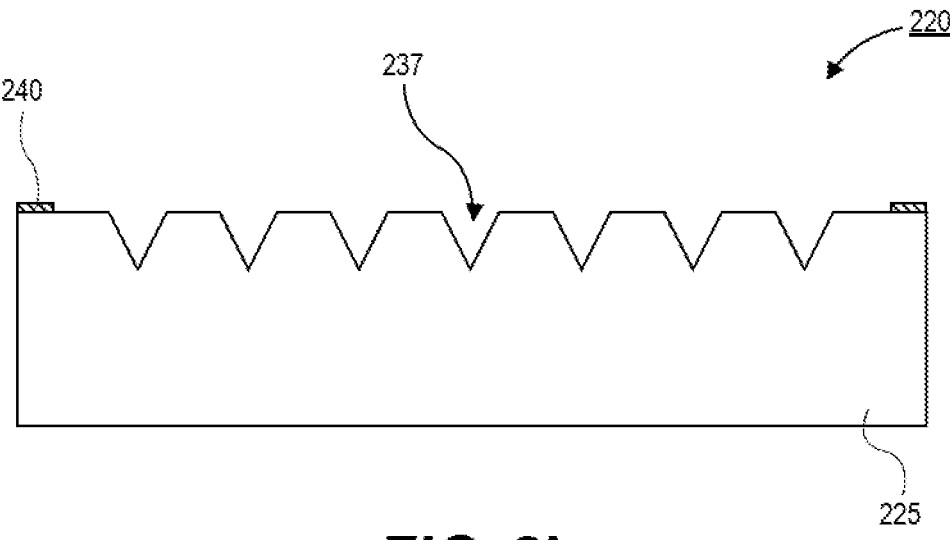
FIG. 2L is a cross-sectional illustration of the die in FIG. 2K, in accordance with an embodiment.
Figures 2M, 2N:
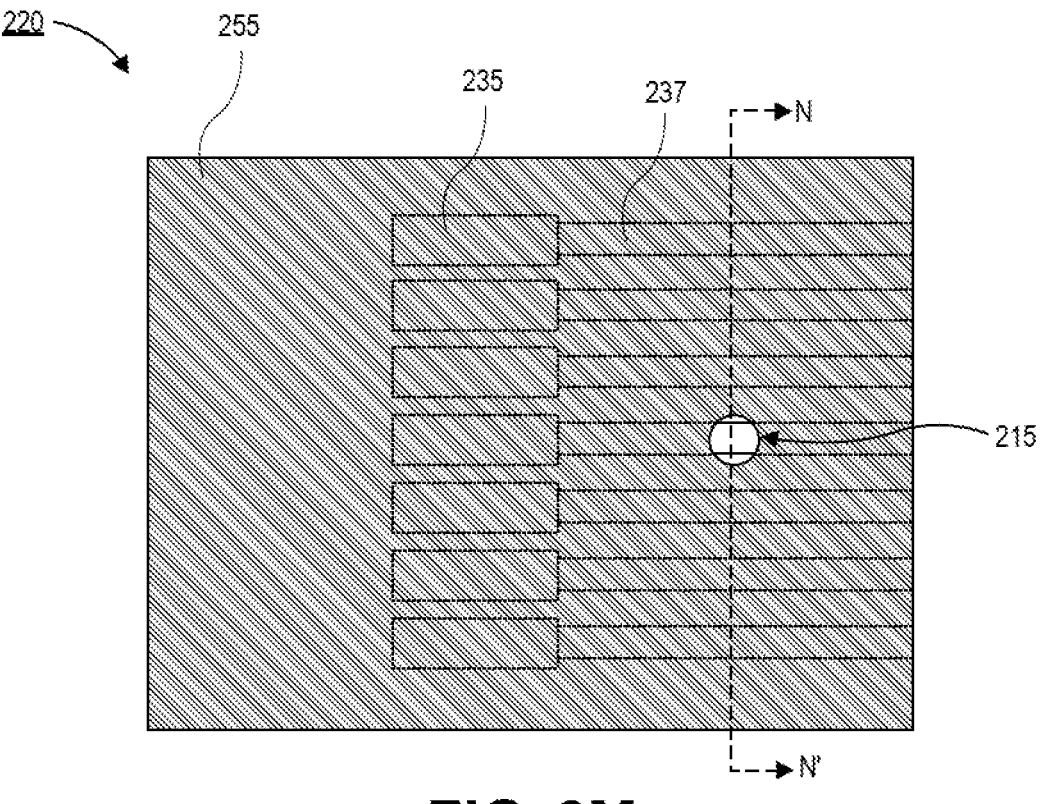
FIG. 2M is a plan view illustration of the die after a second photoresist is disposed over the surface of the die and a bubble is formed in the V-groove region, in accordance with an embodiment.
FIG. 2N is a cross-sectional illustration of the die in FIG. 2M, in accordance with an embodiment.
Figure 2O:
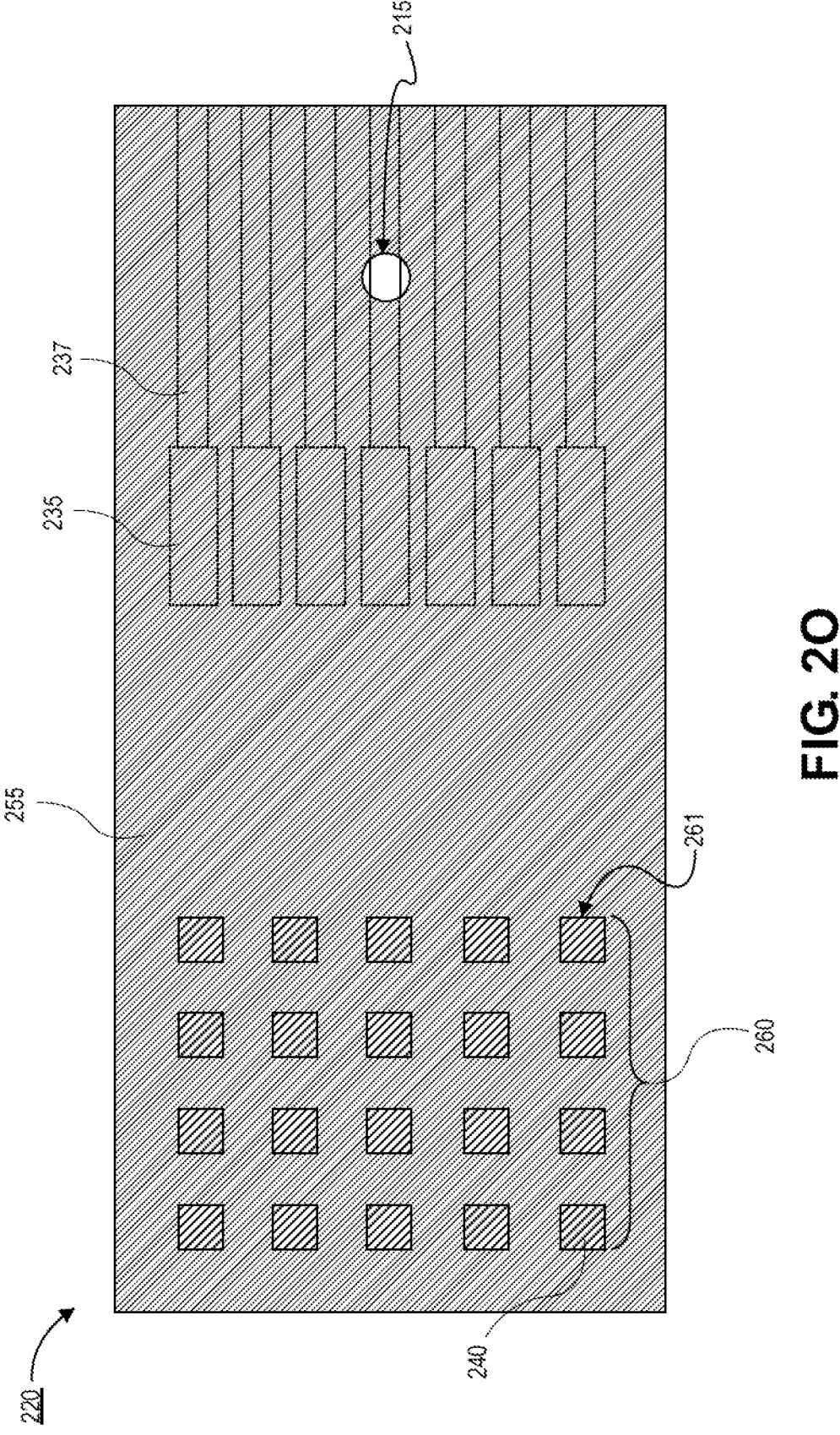
FIG. 2O is a plan view illustration of the die after openings for bumps are formed into the photoresist layer at a bump region of the die, in accordance with an embodiment.
Figure 2P:
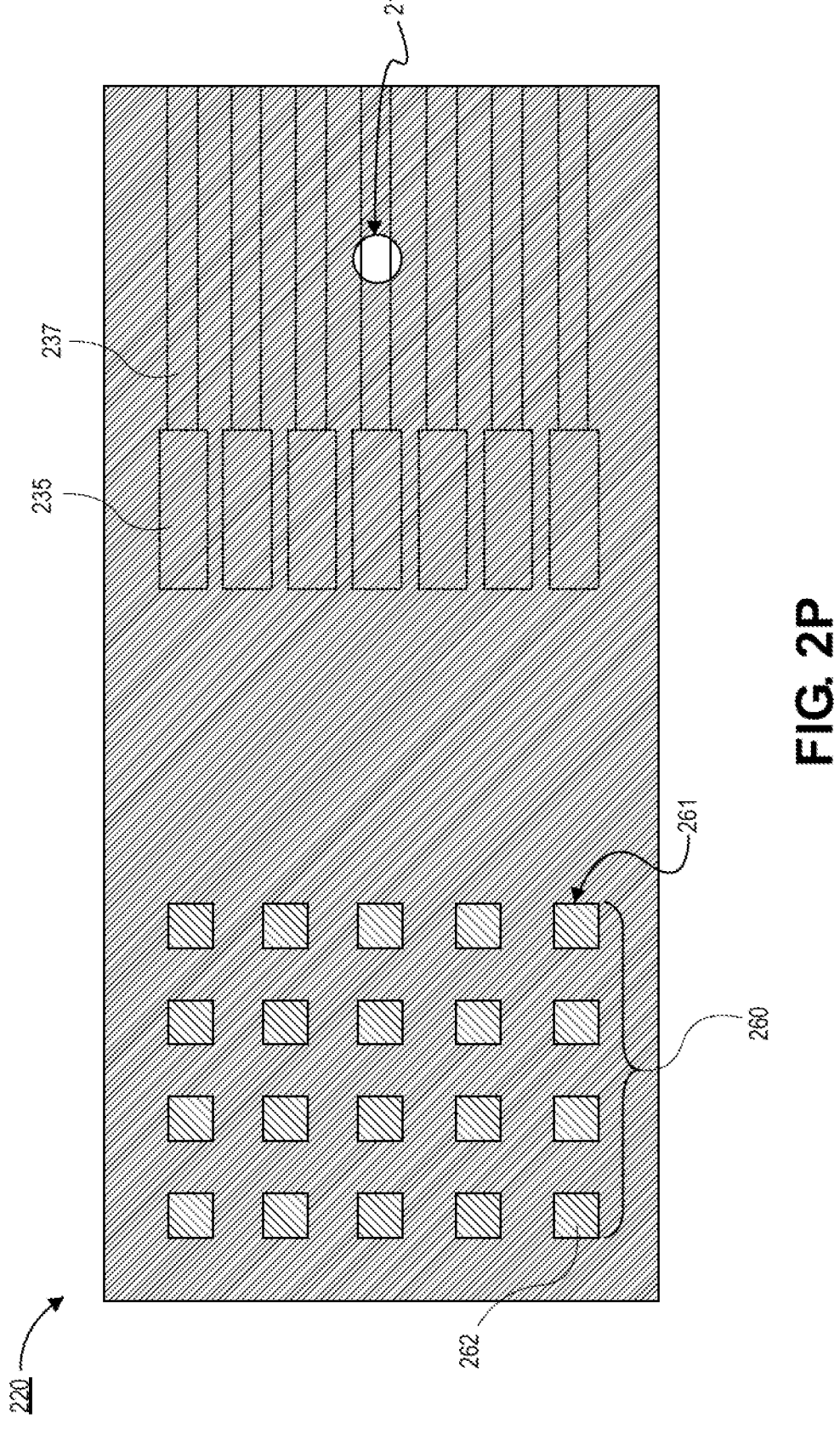
FIG. 2P is a plan view illustration of the die after bumps are plated in the bump region of the die, in accordance with an embodiment.
Figure 2Q:
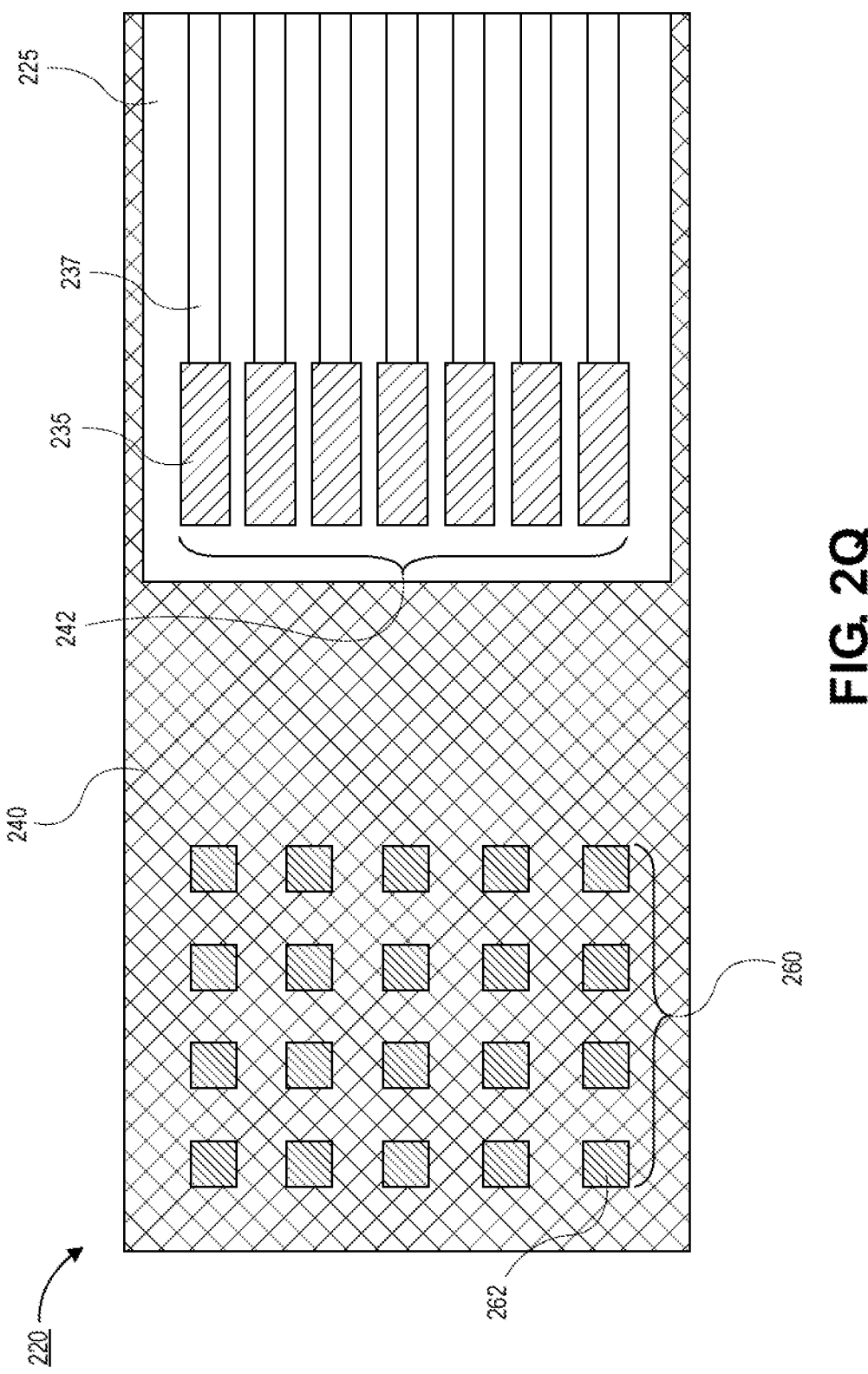
FIG. 2Q is a plan view illustration of the die after the second photoresist layer is removed, in accordance with an embodiment.
Figure 2R:
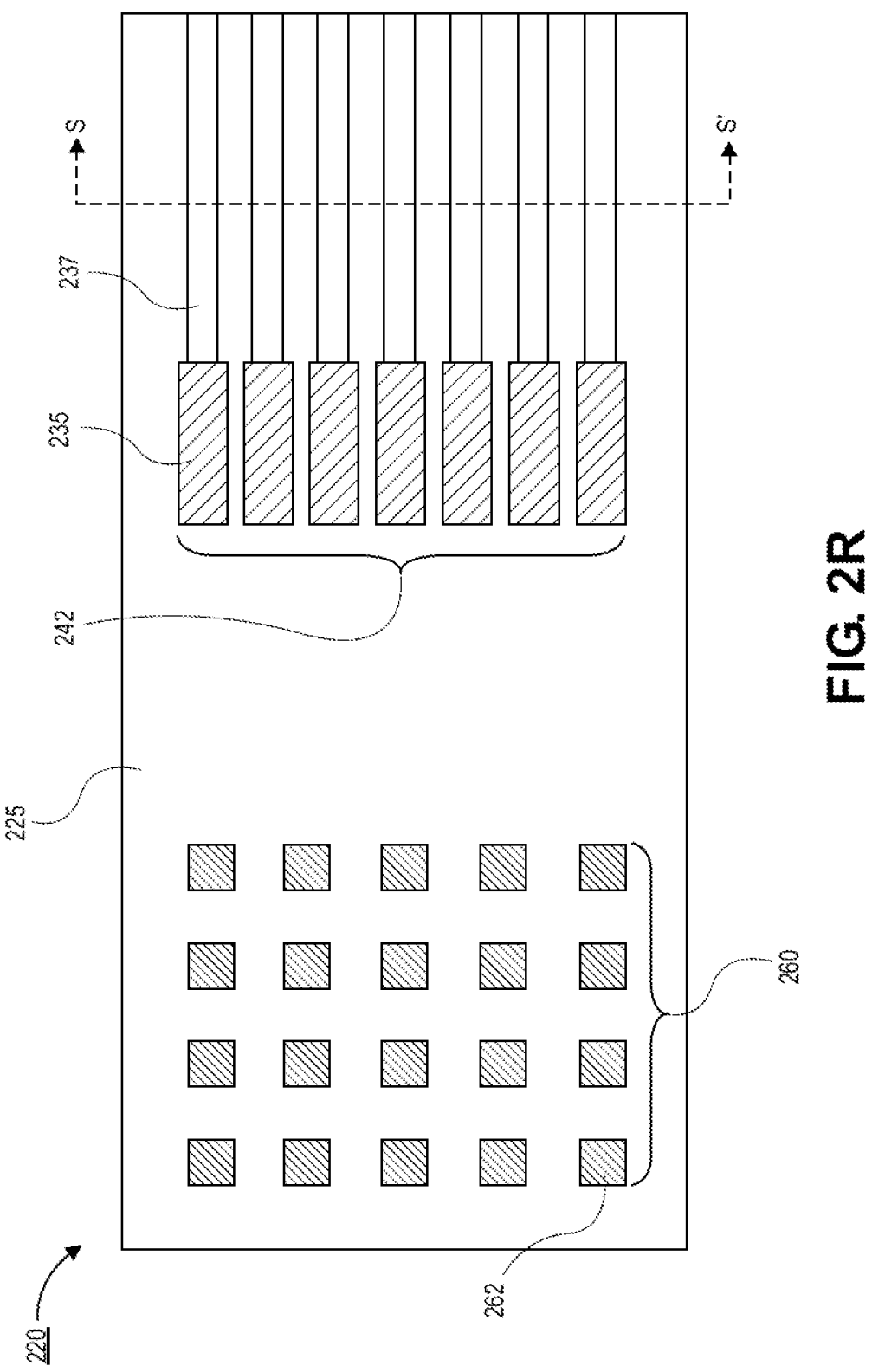
FIG. 2R is a plan view illustration of the die after the UBM is removed, in accordance with an embodiment.
Figure 2S:
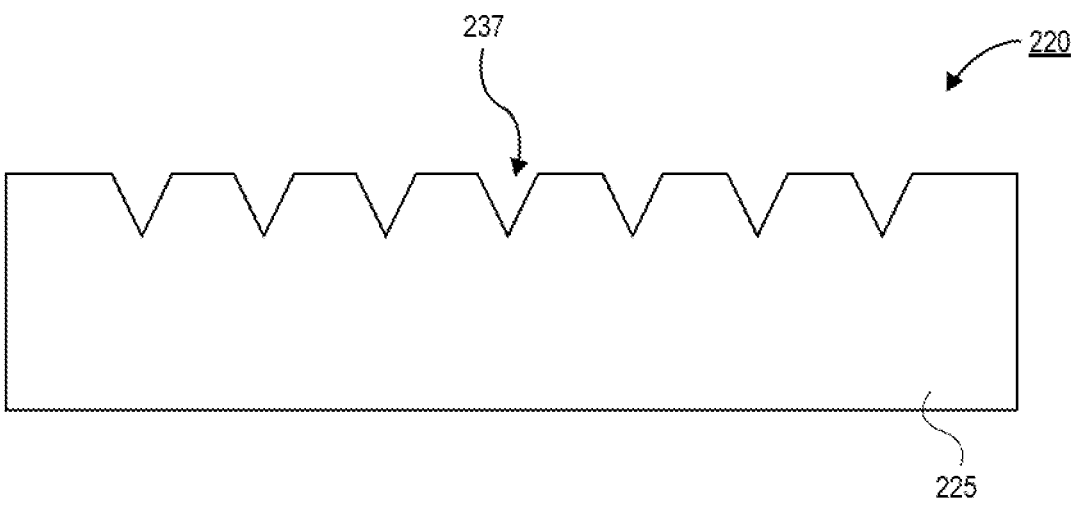
FIG. 2S is a cross-sectional illustration of the die in FIG. 2R, in accordance with an embodiment.
Figure 2T:
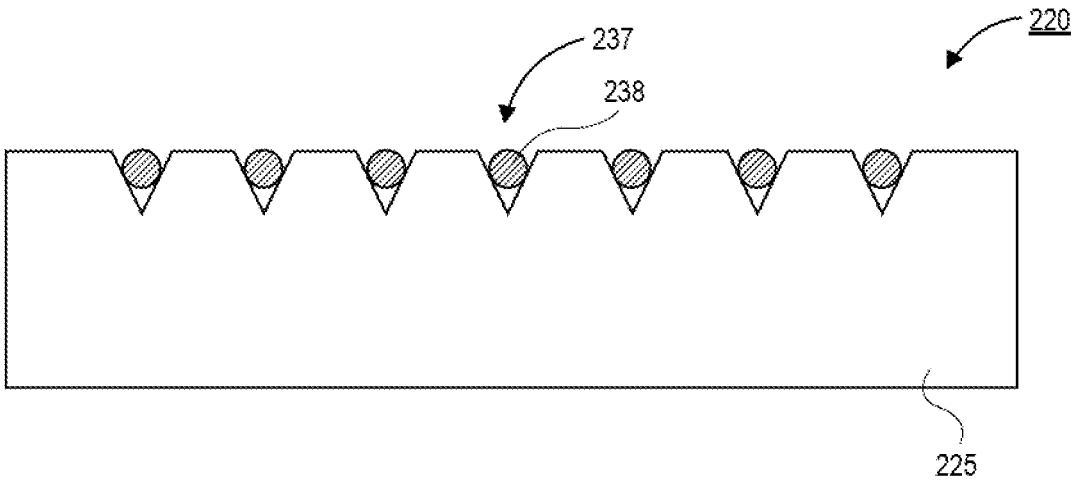
FIG. 2T is a cross-sectional illustration of the die after optical fibers are inserted into the V-grooves, in accordance with an embodiment.

Referring now to FIGS. 2A-2T, a series of illustrations depicting a process for fabricating an optical die with pristine V-grooves is shown, in accordance with an embodiment.

Referring now to FIG. 2A, a plan view illustration of a die 220 is shown, in accordance with an embodiment. In an embodiment, the die 220 may comprise a semiconductor substrate 225. For example, the semiconductor substrate 225 may comprise silicon or the like. In an embodiment, the die 220 may be one die on a wafer with a plurality of dies 220. That is, the die 220 may not yet be singulated from the wafer, and wafer level processing is depicted in the Figures. In other embodiments, the die 220 may already be singulated, or singulated at some point in the process flow of FIGS. 2A-2T.

In an embodiment, the die 220 may comprise a plurality of V-grooves 237. The V-grooves 237 may extend to an edge of the semiconductor substrate 225. An opposite end of the V-grooves 237 may be adjacent to spot size converters 235. In an embodiment, the V-grooves 237 are sized to accommodate optical fibers (as will be described in greater detail below).

Referring now to FIG. 2B, a cross-sectional illustration of the die 220 in FIG. 2A along line B-B' is shown, in accordance with an embodiment. In an embodiment, the plurality of V-grooves 237 may have a true V-shaped profile. In other embodiments, a bottom surface of the V-grooves 237 may be substantially flat. While seven V-grooves 237 are shown in FIG. 2B, it is to be appreciated that any number of V-grooves 237 may be included in the die 220. In an embodiment, a depth of the V-grooves 237 may be approximately 100 μm or less, or approximately 75 μm or less.

Referring now to FIG. 2C, a plan view illustration of the die 220 after a UBM layer 240 is deposited is shown, in accordance with an embodiment. In an embodiment, the UBM layer 240 may comprise titanium and copper. Though, it is to be appreciated that other conductive materials may be used for the UBM layer 240. In an embodiment, the UBM layer 240 may be deposited with a sputtering process or the like. The UBM layer 240 may be blanket deposited over an entire surface of the die 220.

Referring now to FIG. 2D, a cross-sectional illustration of the die 220 in FIG. 2C along line D-D' is shown, in accordance with an embodiment. In an embodiment, the die 220 includes a conformal UBM layer 240. That is, the UBM layer 240 conforms to the profile of the V-grooves 237. In an embodiment, a thickness of the UBM layer 240 may be approximately 5 μm or smaller, or approximately 1 μm or smaller.

Referring now to FIG. 2E, a plan view illustration of the die 220 after a first photoresist layer 244 is disposed over the die 220 is shown, in accordance with an embodiment. In an embodiment, the first photoresist layer 244 may be deposited with a spin coating process. While not shown for simplicity, bubbles or the like may be formed over the V-groove regions. However, at this photoresist layer 244, bubbles over the V-groove region are not a problem since the first photoresist layer 244 will be completely removed from the V-groove region in a subsequent processing operation.

Referring now to FIG. 2F, a cross-sectional illustration of the die 220 in FIG. 2E along line F-F' is shown, in accordance with an embodiment. As shown, the first photoresist layer 244 may fill the remainder of the V-grooves 237. Since the first photoresist layer 244 is formed with a spin coating process, the first photoresist layer 244 may have a substantially planar top surface. That is, the first photoresist layer 244 may not be conformal to the V-grooves 237.

Referring now to FIG. 2G, a cross-sectional illustration of the die 220 after the first photoresist layer 244 is patterned is shown, in accordance with an embodiment. In an embodiment, the portion of the first photoresist layer 244 in a V-groove region 242 may be removed. For example, an exposure process followed by a developing process may be used to pattern the first photoresist layer 244. As shown, removal of the portions of the first photoresist layer 244 expose the V-grooves 237 and the portion of the UBM over the V-grooves 237.

Referring now to FIG. 2H, a cross-sectional illustration of the die 220 in FIG. 2G along line H-H' is shown, in accordance with an embodiment. As shown, the first photoresist layer 244 is cleared from the V-groove region 242 and portions of the UBM 240 over the V-grooves 237 are exposed.

Referring now to FIG. 2I, a plan view illustration of the die 220 after the UBM layer 240 is removed from the V-groove region 242 is shown, in accordance with an embodiment. In an embodiment, the UBM layer 240 may be removed with an etching process, such as a wet etching process. Removal of the UBM layer 240 exposes the underlying semiconductor substrate 225.

Referring now to FIG. 2J, a cross-sectional illustration of the die 220 in FIG. 2I along line J-J' is shown, in accordance with an embodiment. As shown, the V-grooves 237 are fully exposed. That is, there is no longer conductive material that is provided over a surface of the V-grooves 237. As such, in subsequent bumping processes, even when there is defects in the photoresist layer, there is no metal to initiate plating. This will leave the V-grooves 237 as pristine and enable high efficiency optical fiber coupling.

Referring now to FIG. 2K, a plan view illustration of the die 220 after the first photoresist layer 244 is fully removed is shown, in accordance with an embodiment. In an embodiment, the first photoresist layer 244 may be removed with a resist stripping process or the like. Removal of the first photoresist layer 244 exposes portions of the UBM layer 240. However, due to the previous patterning, there is no UBM layer 240 in the V-groove region 242.

Referring now to FIG. 2L, a cross-sectional illustration of the die 220 in FIG. 2K along line L-L' is shown, in accordance with an embodiment. As shown, portions of the UBM 240 remain outside of the V-groove region 242, but the V-grooves 237 are completely bare. That is, the semiconductor substrate 225 is exposed in the V-groove region 242.

Referring now to FIG. 2M, a plan view illustration of the die 220 after a second photoresist layer 255 is disposed over a surface of the die 220 is shown, in accordance with an embodiment. In an embodiment, the second photoresist layer 255 may be deposited with a spin coating process. For example, a liquid is dispensed on the die 220, and the die 220 is spun in order to evenly distribute the second photoresist layer 255 over a surface of the die 220. The second photoresist layer 255 may be baked after the spinning process. As shown, the spin coating process may result in defects in the second photoresist layer 255. Particularly, one or more bubbles 215 may occur in the V-groove region 242. For example, bubble 215 shown in FIG. 2M is positioned over one of the V-grooves 237.

Referring now to FIG. 2N, a cross-sectional illustration of the die 220 in FIG. 2M along line N-N' is shown, in accordance with an embodiment. As shown, the bubble 215 may expose a portion of the semiconductor substrate 225. Particularly, a V-groove 237 is exposed by the bubble 215. However, since there is no metallic material over the exposed V-groove 237, there will be no plating in the area of the bubble.

Referring now to FIG. 2O, a plan view illustration of the die 220 after openings 261 are formed through the second photoresist 255 in a bump field region 260 is shown, in accordance with an embodiment. As shown, the openings 261 may expose the underlying UBM layer 240. However, as shown in the V-groove region, the bubble 215 does not expose any metal. As such, the openings 261 will plate, and the bubble 215 will not plate.

Referring now to FIG. 2P, a plan view illustration of the die 220 after bump 262 plating is shown, in accordance with an embodiment. In an embodiment, the plating process may be an electroplating process. As such, a metallic material needs to be provided in order to initiate the plating. The UBM layer 240 provides this metal in bump field 260. Therefore, the bumps 262 only plate in the openings 261. That is, there is no plating in the V-groove region, despite the presence of the bubble 215 opening.

Referring now to FIG. 2Q, a plan view illustration of the die 220 after the second photoresist layer 255 is removed is shown, in accordance with an embodiment. In an embodiment, the second photoresist layer 255 may be removed with a resist stripping process or the like. Removal of the second photoresist layer 255 exposes the UBM layer 240 and the V-grooves 237.

Referring now to FIG. 2R, a plan view illustration of the die 220 after the UBM layer 240 is removed is shown, in accordance with an embodiment. In an embodiment, the UBM layer 240 may be removed with a flash etching process or the like. That is, the minimal etching will not significantly alter the bumps 262 in the bump field 260. As shown, the V-groove region 242 remains pristine in order to accommodate optical fibers with high coupling efficiency. In an embodiment, the bumps 262 may be reflown.

Referring now to FIG. 2S, a cross-sectional illustration of the die 220 in FIG. 2R along line S-S' is shown, in accordance with an embodiment. As shown, the V-grooves 237 are substantially pristine. That is, despite the spin coating process used to form the bumps (out of the plane of FIG. 2S), there is no residual metal left in the V-grooves 237. Accordingly, the V-grooves are prepared to receive optical fibers without any significant alignment issues.

Referring now to FIG. 2T, a cross-sectional illustration of the die 220 after optical fibers 238 are inserted into the V-grooves 237 is shown, in accordance with an embodiment. In an embodiment, the optical fibers 238 may be inserted manually or with machine assisted processes. The optical fibers 238 may sit down in the V-grooves 237 in order to provide passive alignment. That is, the semiconductor material of the V-grooves 237 may directly contact the optical fibers 238. The optical fibers 238 may be optically coupled to the spot size converters 235.

Figure 3:
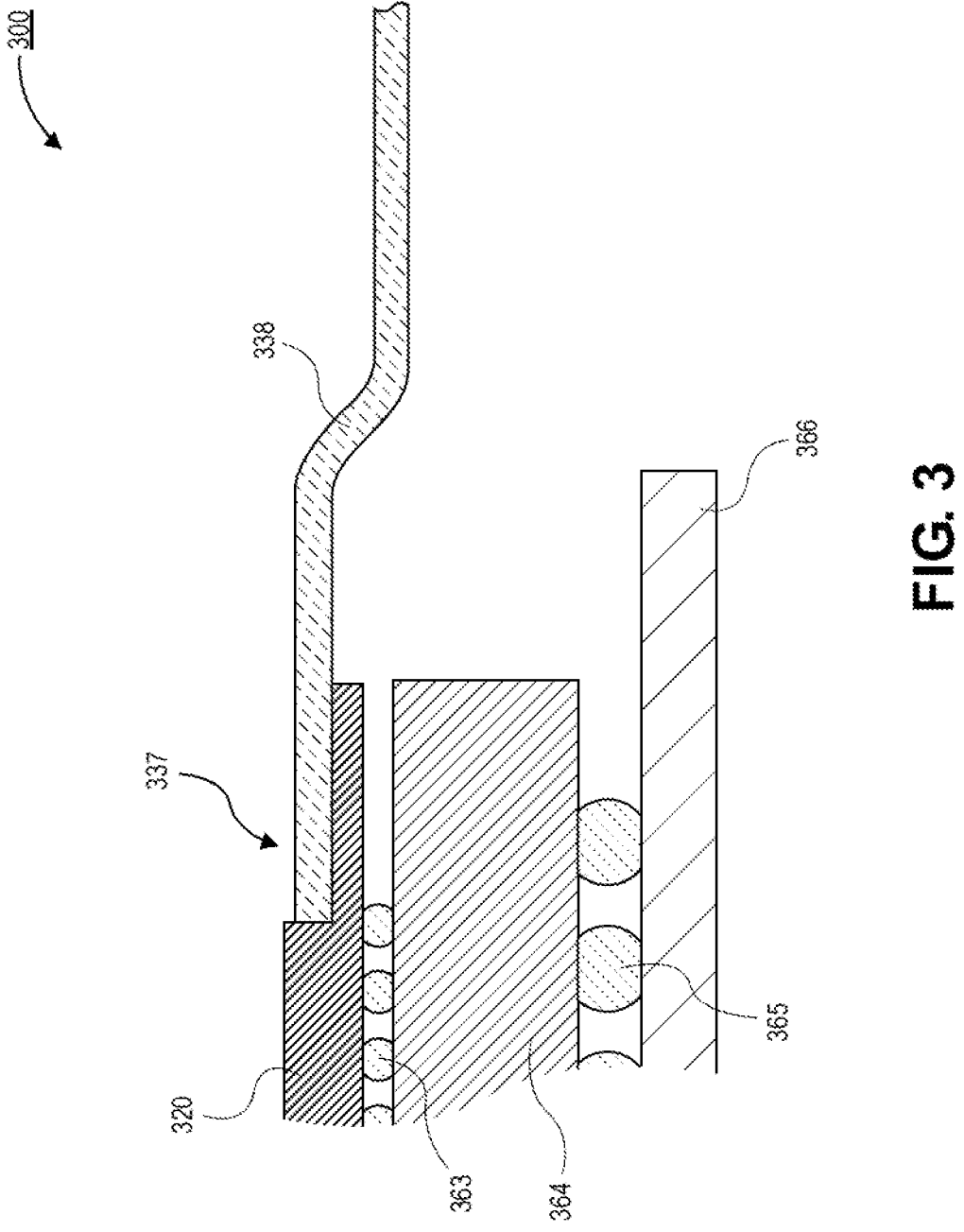
FIG. 3 is a cross-sectional illustration of an electronic system with a die that includes a V-groove and an optical fiber is inserted into the V-groove, in accordance with an embodiment.

Referring now to FIG. 3 a cross-sectional illustration of an electronic system 300 is shown, in accordance with an embodiment. In an embodiment, the electronic system 300 may comprise a board 366, such as a printed circuit board (PCB). In an embodiment, the board 366 may be coupled to a package substrate 364 by interconnects 365. While shown as solder balls, it is to be appreciated that the interconnects 365 may include any interconnect architecture (e.g., sockets or the like). In an embodiment, the package substrate 364 may be coupled to a die 320 by interconnects 363. In an embodiment, the die 320 may comprise a V-groove 337. In an embodiment, an optical fiber 338 may be secured in the V-groove 337.

Figure 4:
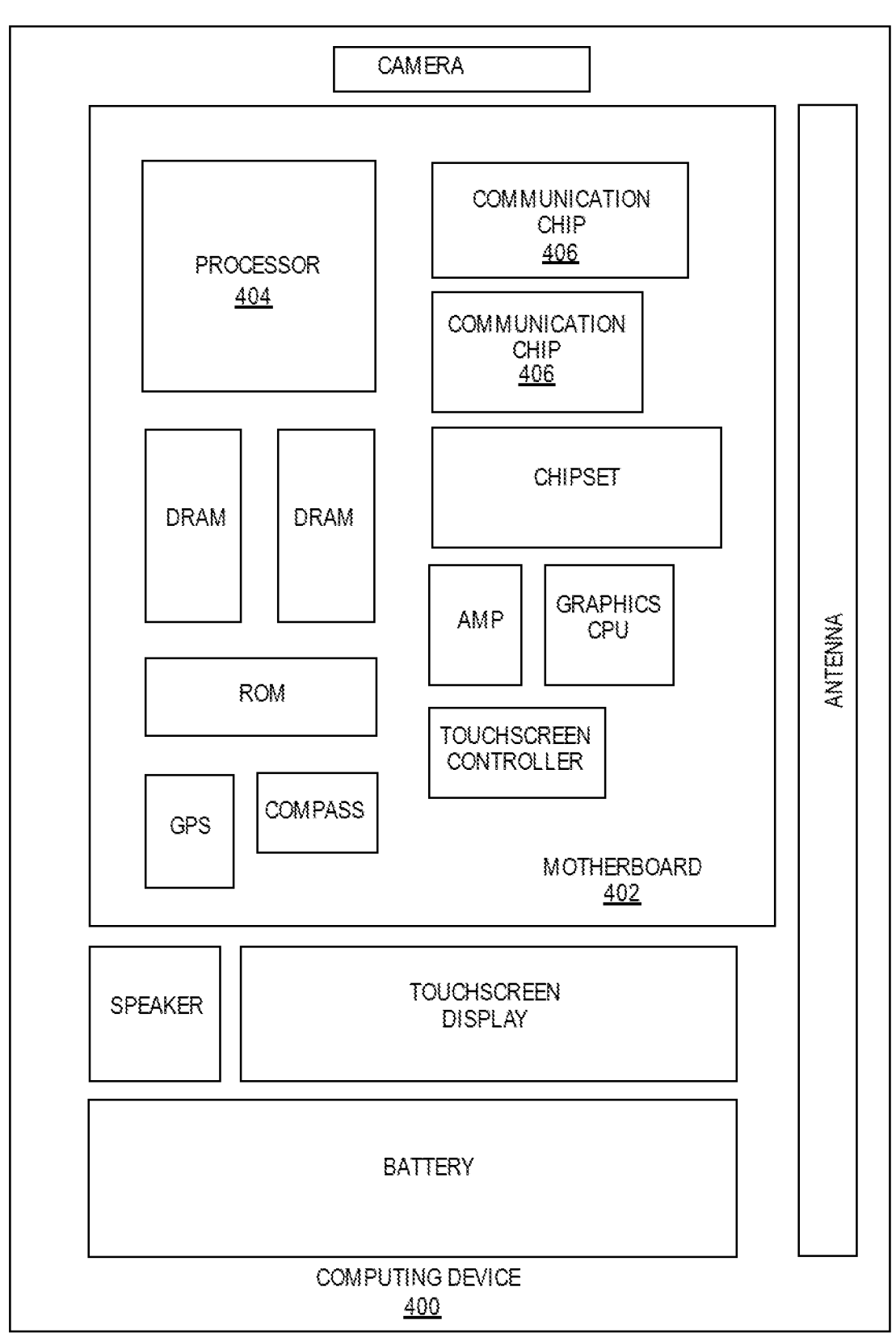
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be part of an electronic package that includes an optical fiber that sits in a pristine V-groove, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be part of an electronic package that includes an optical fiber that sits in a pristine V-groove, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic device, comprising: a die, wherein the die comprises: a semiconductor substrate; a bump field over the semiconductor substrate; and a V-groove into the semiconductor substrate, wherein the V-groove extends to an edge of the semiconductor substrate, and wherein the V-groove is free from conductive material; and an optical fiber inserted into the V-groove.

Example 2: the electronic device of Example 1, further comprising: a spot size converter at an end of the V-groove away from the edge of the semiconductor substrate.

Example 3: the electronic device of Example 2, wherein the optical fiber is optically coupled to the spot size converter.

Example 4: the electronic device of Examples 1-3, further comprising a plurality of V-grooves, and a plurality of optical fibers, wherein individual ones of the plurality of optical fibers are inserted into individual ones of the plurality of V-grooves.

Example 5: the electronic device of Examples 1-4, wherein the semiconductor substrate comprises silicon.

Example 6: the electronic device of Examples 1-5, wherein the die is coupled to a package substrate.

Example 7: the electronic device of Example 6, wherein the package substrate is coupled to a board.

Example 8: a method of forming an electronic device, comprising: providing a semiconductor substrate, wherein the semiconductor substrate comprises a bump field region and a V-groove region, wherein the V-groove region comprises a plurality of V-grooves that extend to an edge of the semiconductor substrate; plating an under bump metallization (UBM) over the semiconductor substrate in the bump field region and the V-groove region; removing the UBM from over the V-groove region; disposing a resist over the semiconductor substrate; forming openings through the resist in the bump field region; plating bumps in the openings; removing the resist; and removing the UBM from the surface of the semiconductor substrate.

Example 9: the method of Example 8, wherein removing the UBM from the V-groove region comprises: disposing a UBM resist over the semiconductor substrate; forming an opening through the resist in the V-groove region; and etching the exposed UBM in the V-groove region.

Example 10: the method of Example 8 or Example 9, wherein disposing the resist over the semiconductor substrate is implemented with a spin coating process.

Example 11: the method of Example 10, wherein a bubble is formed in the resist over the V-groove region.

Example 12: the method of Example 11, wherein no plating occurs in the V-groove region at the location of the bubble during the plating of bumps in the openings.

Example 13: the method of Examples 8-12, further comprising: reflowing the bumps.

Example 14: the method of Examples 8-13, wherein there is no metal in the V-groove region after plating the bumps in the opening.

Example 15: the method of Examples 8-14, wherein the UBM comprises titanium and copper.

Example 16: the method of Examples 8-15, wherein the plurality of V-grooves are terminated by a plurality of spot size converters.

Example 17: the method of Example 16, further comprising: inserting a plurality of optical fibers into the plurality of V-grooves, wherein individual ones of the plurality of optical fibers are optically coupled to individual ones of the plurality of spot size converters.

Example 18: the method of Examples 8-17, further comprising: attaching the semiconductor substrate to a package substrate.

Example 19: the method of Example 18, further comprising: attaching the package substrate to a board.

Example 20: the method of Examples 8-19, wherein the semiconductor substrate comprises silicon.

Example 21: a method of forming an electronic device, comprising: providing a semiconductor substrate, wherein the semiconductor substrate comprises a bump field region and a V-groove region, wherein the V-groove region comprises a plurality of V-grooves that extend to an edge of the semiconductor substrate, and wherein the plurality of V-grooves are terminated by a plurality of spot size converters; plating an under bump metallization (UBM) over the semiconductor substrate in the bump field region and the V-groove region; disposing a first resist over the semiconductor substrate; forming a first opening through the first resist in the V-groove region; and etching the exposed UBM in the V-groove region; disposing a second resist over the semiconductor substrate; forming second openings through the resist in the bump field region; plating bumps in the second openings; removing the resist; removing the UBM from the surface of the semiconductor substrate; and inserting a plurality of optical fibers into the plurality of V-grooves, wherein individual ones of the plurality of optical fibers are optically coupled to individual ones of the plurality of spot size converters.

Example 22: the method of Example 21, wherein there is no metal in the V-groove region after plating the bumps in the second openings.

Example 23: the method of Example 21 or Example 22, wherein the UBM comprises titanium and copper.

Example 24: an electronic system, comprising: a board; a package substrate coupled to the board; a die coupled to the package substrate, wherein the die comprises: a semiconductor substrate; a bump field over the semiconductor substrate; and a V-groove into the semiconductor substrate, wherein the V-groove extends to an edge of the semiconductor substrate, and wherein the V-groove is free from conductive material; and an optical fiber inserted into the V-groove.

Example 25: the electronic system of Example 24, further comprising: a spot size converter on the semiconductor substrate that is optically coupled to the optical fiber.

What is claimed is:

1. An electronic device, comprising:
a die, wherein the die comprises:
a semiconductor substrate;
a bump field over the semiconductor substrate; and
a V-groove into the semiconductor substrate, wherein the V-groove extends to an edge of the semiconductor substrate, and wherein the V-groove is free from conductive material;
an optical fiber inserted into the V-groove; and
a spot size converter at an end of the V-groove away from the edge of the semiconductor substrate, the spot size converter intervening between the end of the V-groove and the bump field.

2. The electronic device of claim 1, wherein the optical fiber is optically coupled to the spot size converter.

3. The electronic device of claim 1, further comprising a plurality of V-grooves, and a plurality of optical fibers, wherein individual ones of the plurality of optical fibers are inserted into individual ones of the plurality of V-grooves.

4. The electronic device of claim 1, wherein the semiconductor substrate comprises silicon.

5. The electronic device of claim 1, wherein the die is coupled to a package substrate.

6. The electronic device of claim 5, wherein the package substrate is coupled to a board.

7. An electronic system, comprising:
a board;
a package substrate coupled to the board;
a die coupled to the package substrate, wherein the die comprises:
a semiconductor substrate;
a bump field over the semiconductor substrate; and
a V-groove into the semiconductor substrate, wherein the V-groove extends to an edge of the semiconductor substrate, and wherein the V-groove is free from conductive material;
an optical fiber inserted into the V-groove; and
a spot size converter at an end of the V-groove away from the edge of the semiconductor substrate, the spot size converter intervening between the end of the V-groove and the bump field.

8. The electronic system of claim 7, wherein the spot size converter is optically coupled to the optical fiber.

* * * * *